United States Patent
Chitre et al.

(10) Patent No.: US 6,661,781 B1
(45) Date of Patent: Dec. 9, 2003

(54) MULTICARRIER DEMUX/DEMOD (MCDD) WIRELESS NETWORK ARCHITECTURE

(75) Inventors: Dattakumar M. Chitre, Silver Spring, MD (US); Soheil I. Sayegh, Gaithersburg, MD (US)

(73) Assignee: Comsat Corporation, Bethesda, MD (US)

(*) Notice: Subject to any disclaimer, the term of this patent is extended or adjusted under 35 U.S.C. 154(b) by 0 days.

(21) Appl. No.: 09/424,266

(22) PCT Filed: Jul. 15, 1998

(86) PCT No.: PCT/US98/14200
§ 371 (c)(1),
(2), (4) Date: Nov. 19, 1999

(87) PCT Pub. No.: WO99/04508
PCT Pub. Date: Jan. 28, 1999

Related U.S. Application Data

(60) Provisional application No. 60/052,539, filed on Jul. 15, 1997.

(51) Int. Cl.[7] .............................. H04Q 7/00; H04J 4/00
(52) U.S. Cl. ..................... 370/330; 370/343; 370/436; 370/468
(58) Field of Search ................. 370/319, 321, 370/326, 329, 330, 337, 344, 347, 348, 395.1, 322, 436, 442, 443, 343, 468; 455/450, 451, 452

(56) References Cited

U.S. PATENT DOCUMENTS

| | | | |
|---|---|---|---|
| 3,548,108 A | * 12/1970 | Yamato | 370/319 |
| 4,768,187 A | 8/1988 | Marshall | |
| 4,783,779 A | * 11/1988 | Takahata et al. | 370/344 |
| 4,868,811 A | * 9/1989 | Suzuki | 370/442 |
| 4,870,642 A | * 9/1989 | Nohara et al. | 370/319 |
| 4,965,798 A | 10/1990 | Mostafa et al. | |
| 5,208,804 A | 5/1993 | Wilson et al. | |
| 5,349,580 A | 9/1994 | Hester et al. | |
| 5,526,350 A | 6/1996 | Gittins et al. | |
| 5,592,469 A | 1/1997 | Szabo | |
| 5,625,877 A | 4/1997 | Dunn et al. | |
| 5,675,732 A | 10/1997 | Majeti et al. | |
| 5,812,545 A | * 9/1998 | Liebowitz et al. | 370/337 |
| 6,018,528 A | * 1/2000 | Gitlin et al. | 370/436 |
| 6,377,561 B1 | * 4/2002 | Black et al. | 370/330 |

FOREIGN PATENT DOCUMENTS

| | | |
|---|---|---|
| EP | 0 719 062 A2 | 6/1996 |
| WO | WO 94/14273 A1 | 6/1994 |

OTHER PUBLICATIONS

Hung et al, ATM via Satellite: A Framework and Implementations, Baltzer Journals, pp. 1–22, Apr. 15, 1996.*
Mankarious, A Full Mesh Asynchronous Transfer Mode (ATM) Satellite Communications Network, IEEE, pp. 11–15, 1995.*
D.M. Chitre et al, "Satellite ATM Modem", 1997 IEEE p. 948–952.

* cited by examiner

Primary Examiner—Seema S. Rao
Assistant Examiner—Frank Duong
(74) Attorney, Agent, or Firm—Sughrue Mion, PLLC

(57) ABSTRACT

An apparatus and method for providing bandwidth on demand service in a wireless communication system having at least one user station, including a frequency divider for dividing a selected bandwidth into a plurality of frequency subdivisions. Also included is a unit for assigning a first number of frequency subdivisions to the individual user stations having a first total bandwidth, commensurate with the volume of transmission traffic. There also is a unit for changing the first number to a second number having a second total bandwidth commensurate with the change of the volume of transmission traffic.

54 Claims, 3 Drawing Sheets

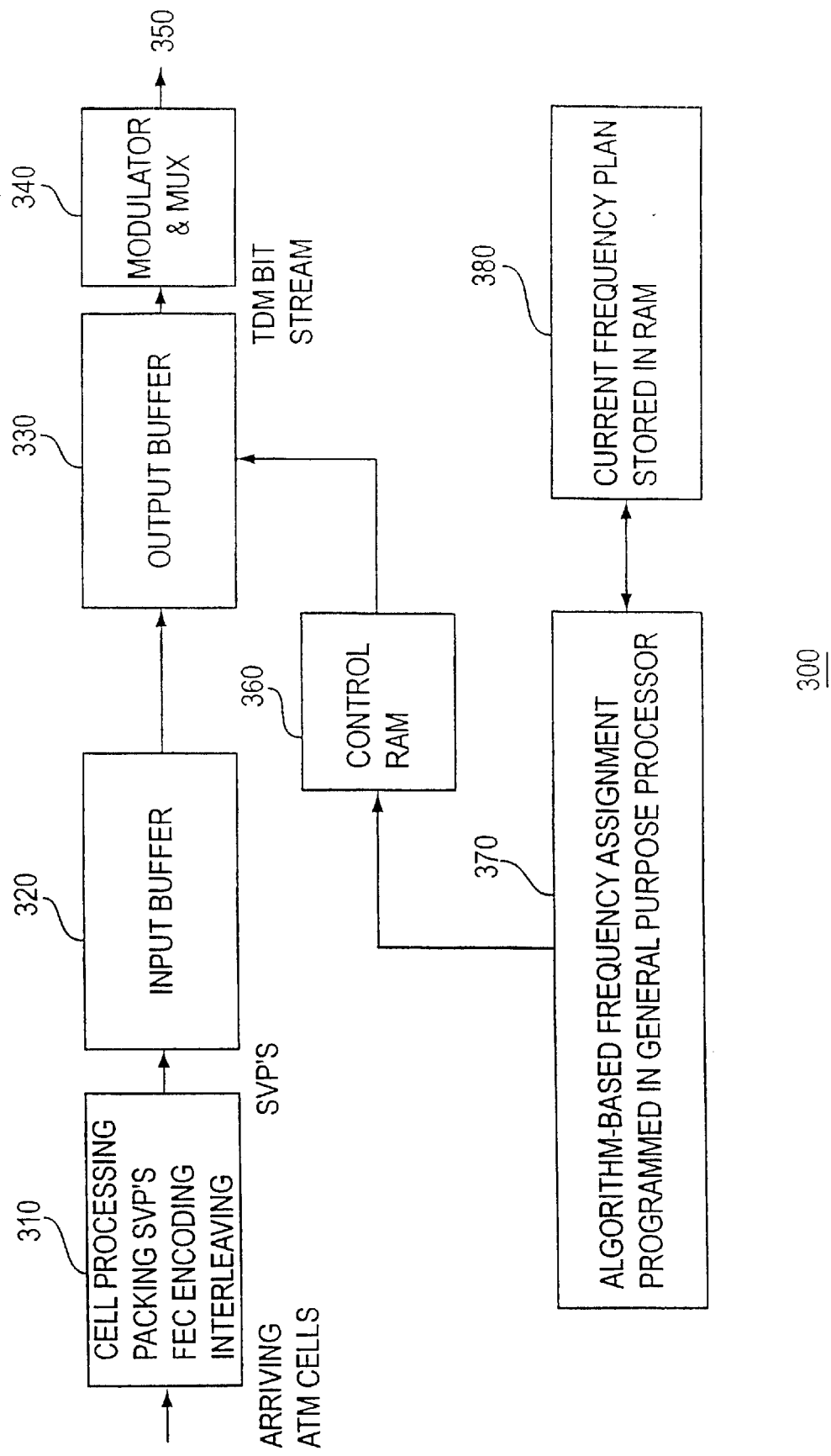

MULTICARRIER DEMUX/DEMOD (MCDD) WIRELESS NETWORK ARCHITECTURE

The present application is based on U.S. provisional application Ser. No. 60-052,539 filed on Jul. 15, 1997 and priority therefrom is claimed under 35 U.S.C. §120. The entire content of Provisional Application Ser. No. 60-052,539 is incorporated herein by reference.

FIELD OF THE INVENTION

The present invention relates to the efficient and reliable transmission of packet or cell-based information, such as frame relay, SS#7, ISDN, Internet or asynchronous transfer mode (ATM) based information, via wireless (terrestrial or satellite) telecommunication network. The techniques and the resulting wireless network are applicable to both terrestrial and satellite wireless environment and is particularly applicable to an Asynchronous Transfer Mode (ATM) network or frame relay network, although the application to other networks having cell or packet transmissions would be understood by one of ordinary skill in the art without undue experimentation. Although the examples of the applicability of this invention are drawn mostly to an ATM satellite communications network, it would be clear that the underlying invention is applicable to other cell and packet systems.

The implementation of the invention results in a mesh heterogeneous satellite network with the following major characteristics:

Single satellite hop connectivity among terminals of widely varying capabilities (uplink rates varying from 8 Kbps to 8 Mbps); and Simultaneous Multimedia/Multiservice Communications Sessions from a terminal with multiple destinations via a single modem and a single uplink and downlink chain.

BACKGROUND OF THE INVENTION

While the present discussion uses Asynchronous Transfer Mode (ATM) transmission by way of example to define the problems with conventional bandwidth on demand systems, this invention is not limited to ATM systems. Distinct advantages are available in other transmission systems, including those based on frame relay, Internet and ISDN/SS#7 protocols, when this MCDD architecture is implemented. Problems with conventional ATM and advantages of the present invention are presented in detail, but one of skill in the art would understand that these advantages would also benefit other transmission schemes such as ISDN, Internet and SS#7.

ATM is a transmission and switching technology which has been standardized to carry statistically multiplexed traffic of different kinds—voice, date, and video. The bandwidth requirements for ATM traffic varies with the fluctuations in the user generated traffic, which can vary over a wide range. Also, the traffic generated from a particular source could be intended for a number of geographically dispersed destinations.

These salient features of ATM traffic demand simultaneous connectivity from a source to multiple destinations. The bandwidth requirements for each of these connections can vary widely.

The traditional Frequency Division Multiple Access (FDMA) (either single channel or multiple channels per carrier) method to provide single hop wireless and satellite ATM mesh connectivity among several terminals is very impractical for the following reasons. Simultaneous connectivity among multiple terminals needs a bank of modems and a number of uplink and downlink chains making the system very expensive. Also, the ATM cell transfer delay becomes large for the lower rate carriers, even though the terminal may be transmitting at a much higher aggregate rate.

The traditional Time Division Multiple Access (TDMA) or the enhanced multi-frequency (MF) TDMA systems work well at high rates (e.g. 2 MBPS or higher). However, an MF-TDMA system is not efficient if the carriers are of widely different rates of lower speeds (e.g. 8 Kbps) and higher speeds (e.g. 2 Mbps or 8 Mbps) which need to be considered together as a whole system. Considering that ATM is a scalable technology and that a terminal may be capable of transmitting at only low rates, such as 8 Kbps, to an MF-TDMA system cannot handle ATM traffic from such terminals in an efficient-manner.

Bandwidth on demand is typically achieved in the MF-TDMA system by a separate channel (a time slot on a frequency) from each terminal to a Network Control Center (NCC). According to the present invention, a request for bandwidth can be multiplexed with the traffic on any existing transmitting carrier, thereby reducing the requirement for a request channel considerably. Furthermore, since the bandwidth request can be received by all terminals, a distributed bandwidth allocation algorithm can be easily implemented.

In an MF-TDMA system, traffic from a terminal to multiple destinations is carried in different time slots with different rates. Thus, the traffic at lower rates suffers greater ATM cell delay. According to the present invention, the traffic from a terminal to different destinations can be multiplexed and aggregated on a larger carrier thereby reducing the ATM cell delay.

Finally, the satellite environment leads to a number of major challenges in the ability to provide satellite-based ATM services. These challenges stem from the fundamental differences in the satellite/wireless and fiber environments and from the fact that the ATM network architecture and protocols are designed for fiber optic cable infrastructure.

Specific problems arise because of three inherent characteristics of satellite links—(a) errors, (b) delay, and (c) bandwidth limitations, as discussed in D.M. Chitre, D. Gokhale, T. Henderson, J. Lunsford and N. Mathews, 1994, "Asynchronous Transfer Mode Operation Via Satellite: Issues, Challenges and Resolutions". *International Journal of Satellite Communications*, Vol. 12, pp. 211–222.7.

Satellite RF links have considerably degraded error performance with respect to fiber optic links. For example, ATM protocols assume that a transmission medium has a very low Bit Error Ratio (BER)($10^{-12}$) and that bit errors occur randomly. In contrast, the bit error ratios associated with terrestrial wireless and satellite communications are much higher (on the order of $10^{-3}$ to $10^{-8}$) and tend to fluctuate with atmospheric conditions.

In addition, in satellite systems, typical forward error corrected satellite links will have bursty errors with variable error rate as opposed to random errors on the fiber links. ATM operation is intolerant of burst errors, and the ATM quality of service requirements for multimedia applications are much more stringent than what a typical satellite link will provide. The one-way propagation delay of around 250 msec., which is intrinsic to geosynchronous satellite communications has an adverse impact on the data communication protocols, such as TCP at high speed (fractional T1 or more), and on the ATM traffic and congestion control procedures.

Furthermore, satellite bandwidth, and terrestrial wireless bandwidth to a lesser extent, is a precious asset. Thus, the cost of bandwidth in a wireless network is much higher than in a fiber optic network. Thus, wireless systems tend to be unable to accommodate the bandwidth inefficient operation of ATM protocols. For example, ATM constant bit rate (CBR) speech will require a 70 kbps satellite bearer channel to carry one voice channel. As a result, the onus is on the operator of a bandwidth limited network to either tolerate the bandwidth inefficiencies of ATM technologies or to design special signal processing equipment that reduces the overhead across a bandwidth constrained network path. Therefore, if ATM technologies are to be implemented in wireless networks, more efficient bandwidth utilization schemes must be achieved, as in the present invention.

Current methods for bandwidth on demand/ATM products rely on the TDMA multiple access technique. Single carrier TDMA is not an attractive solution for bandwidth on demand/ATM because the amplifiers at the user transmitting stations must be sized for the peak power, which is much larger than the average power for single carrier TDMA. This is in addition to the additional complexity usually associated with the synchronization requirements of TDMA.

Traditionally, the selection of the multiple access scheme for ATM transmission over satellites is largely based on tradeoffs such as space segment efficiency, cost and complexity of earth stations, and single versus multiple carrier operation, where multiple carrier operation results in necessary amplifier backoff. In traditional FDMA systems, a bank of filters and modems are used. Advances in digital processing have made possible a more attractive multicarrier demultiplexer/demodulator (MCDD) implementation, which allows the flexibility of having different size user stations in the terrestrial wireless or satellite network. Cost savings in the baseband and RF equipment can be realized for the smaller stations which handle only a fraction of the traffic that the larger stations can handle.

SUMMARY OF THE INVENTION

The present invention concerns an apparatus and method applicable to a terrestrial wireless or satellite communication system with a plurality of user stations, wherein bandwidth on demand service is provided to each user station by dividing a selected bandwidth into a plurality of frequency subdivisions and assigning a number of the frequency subdivisions to an individual user station in the wireless or satellite communication system. The number of frequency subdivisions assigned to each user station is maintained to be commensurate the volume of transmission traffic of each user station by changing said number of frequency subdivisions assigned to each individual user station as the volume of transmission traffic of each individual user station changes.

The frequency subdivisions may be of equal or unequal size. In one embodiment, the frequency subdivisions are of equal size, and any newly added frequency subdivisions are adjacent to previously assigned frequency subdivisions.

In a second embodiment, one unequal size frequency subdivision is assigned to a user station, where the size of the frequency subdivision assigned satisfies the current transmission needs of the user station. When the user station transmission requirements change, a new frequency subdivision of the size to satisfy the new transmission requirements replaces the previously assigned frequency subdivision.

A hybrid architecture where some terminals transmit in single carrier mode while other terminals transmit in multiple carrier mode is also within the scope of the present invention.

As used herein, the term "cell" shall be used to mean a fixed size container, such as the ATM cell, and As the term "packet" shall be used to mean and a variable size container, and the term "cell/packet" shall mean generically either or both such container arrangements.

BRIEF DESCRIPTION OF THE DRAWINGS

FIG. 1(a) is an illustration of single carrier transmission in which additional frequency subdivisions around the same center frequency are used when additional capacity is necessary.

FIG. 3 is a block diagram of an apparatus for implementing the present invention.

DETAILED DESCRIPTION OF THE PREFERRED EMBODIMENTS

The present invention is described via the following examples of a bandwidth W on the order of tens of megahertz (MHz) is accessed by a number of earth stations with traffic needs ranging from a few kilobits per second (kbps) to several megabits per second (Mbps) rates.

In a first embodiment, the bandwidth W is uniformly subdivided into frequency subdivisions or slots that each user transmitting station can support, for example, 64 kbps transmission. These frequency subdivisions are assigned for transmission to the user transmitting stations in the network. The bandwidth subdivisions need not be uniform in size, but uniform subdivisions simplify allocation implementation.

According to this embodiment of the present invention, an individual user transmitting station is assigned a number of adjacent frequency subdivisions proportional to its traffic requirement at the present time. In this example, for instance, a user station that requires transmission of 384 kbps would be assigned 6 adjacent frequency subdivisions of 64 kpbs each. The user station would then combine these 6 adjacent subdivisions to transmit a single carrier at 384 kbps.

Figure 1A:
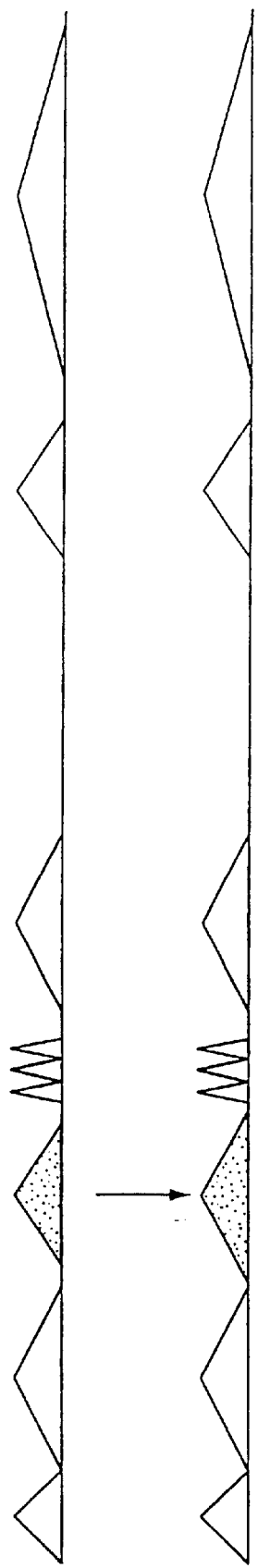
FIG. 1(a) is an illustration of frequency assignments is the MCDD Scheme in a first embodiment of the present invention.
Figure 1B:
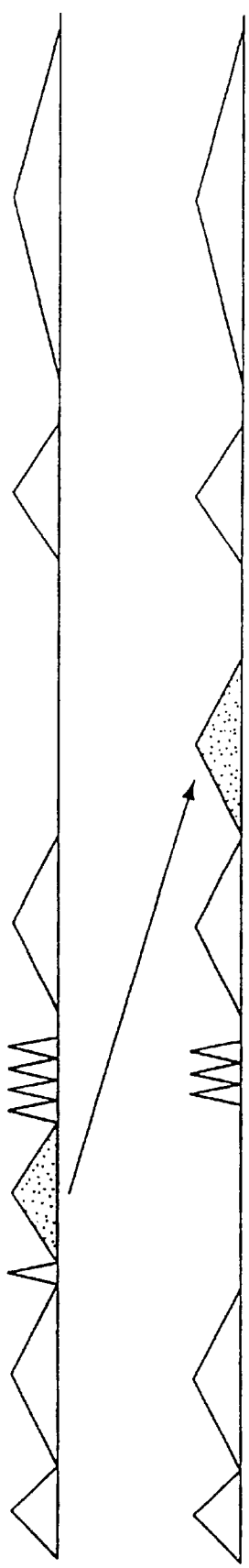
FIG. 1(b) is an illustration of single carrier transmission in which all frequency subdivisions are moved s to different center frequency when additional capacity is necessary.

If at a later time, the user station considered above requires an increase its transmission rate to 512 kbps, it would need 8 adjacent frequency subdivisions of 64 kbps each to transmit a signal carrier at 512 kbps. The necessary frequency subdivisions can be provided in one of two ways. First, as illustrated in FIG. 1(a), if there are 2 vacant subdivisions adjacent to the 6 subdivisions already in use, the 8 adjacent frequencies subdivisions needed could readily be assembled from the previous 6 subdivisions plus the 2 new adjacent frequency subdivisions. Second, as illustrated in FIG. 1(b), if the adjacent subdivisions are not vacant, a new set of 8 adjacent subdivisions around a different center frequency must be used. The previous 6 subdivisions would thus be returned to the pool of vacant or unassigned subdivisions. In either allocation scheme of this embodiment, a single center frequency is assigned to the individual user transmitting station. Request for additional bandwidth may be made through existing communication channels to the Network Control Center (NCC).

A major advantage of such a single carrier transmission is that "backing off" the amplifiers from saturation operation is avoided. Amplifier backoff is required for multi-carrier transmission systems. However, single carrier operation has two disadvantages when compared to multi-carrier transmission. The first disadvantage is the need for multiple adjacent frequency subdivisions. Multi-carrier modems can allocate different carriers on non-adjacent frequency subdivisions, thus obviating the need for reshuffling the frequency slot assignments. This first disadvantage of single carrier operation is not deemed to be significant.

The second disadvantage of single carrier operation is that, since transmission and reception of carriers with different bit rates are needed, the digital signal processing (DSP) operation for single carrier transmission needs to be more flexible. This requirement for additional DSP flexibility translates to a somewhat larger processor (more DSP hardware). This second disadvantage of single carrier operation is also deemed to be minor.

From a DSP standpoint, the optimum techniques for single carrier transmission and for multiple carrier transmission are different. For single carrier transmission/multiple carrier reception, with the carriers in the network having different bit rates and center frequencies, a technique called "Frequency-Domain Filtering," as discussed as discussed in "A Flexible On-Board Demultiplexer/Demodulator", S. J. Campanella and S. I. Sayegh, $12^{th}$ AIAA International Communication Satellite Conference, March, 1988, pp 299–303 and "TDM-FDM Transmultiplexer: Digital Polyphase and FFT", IEEE Transactions on Communications, vol. COM-22, September 1974, pp. 1199–1205.

Figure 2A:
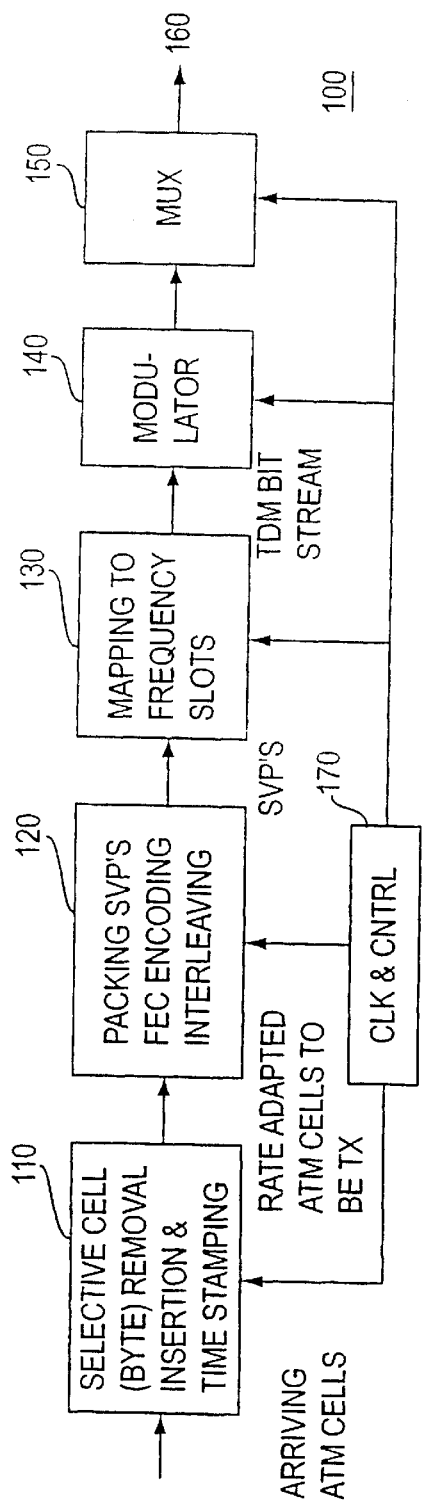
FIGS. 2A and 2B are schematic block diagrams of a transmission apparatus and a reception apparatus, respectively, for implementing the present invention.
Figure 2B:
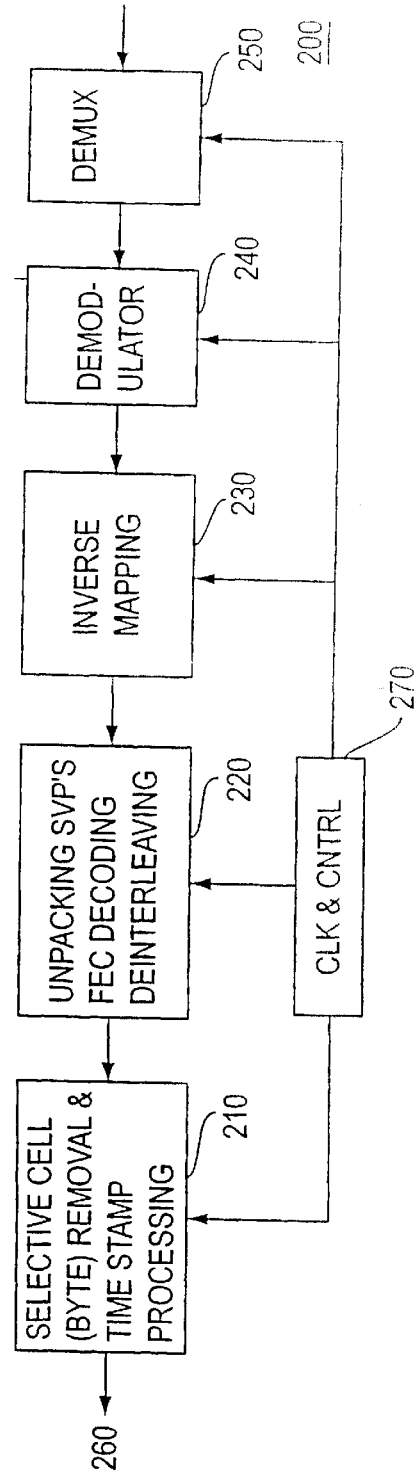

This first embodiment of a technique for providing bandwidth on demand can be implemented by the apparatus illustrated in FIGS. 2A and 2B, which is adapted for ATM cell communication, but clearly could be adapted for other transmission formats as well. Referring to FIG. 2A, which illustrates the outgoing chain 100 at the transmitting earth station, the ATM cells along with some overhead information are packaged in a satellite virtual package (SVP) that contains a small number of ATM cells. Arriving ATM cells are processed in unit 110 for selective removal of cell (byte) overhead and for insertion of time stamping, as required. The rate-adapted ATM cells that are output from the unit 110 for transmission are packed into SVP formats and are subject to FEC encoding and interleaving in SVP formatting unit 120. The SVP's are them mapped to frequency slots in unit 130, which outputs a TDM bit stream. The. TDM signals are modulated in modulator 140 and multiplexed in multiplexer 150 prior to being output on line 160 for transmission from a station antenna (not shown). All of the functions in the transmission chain are under common clock and control unit 170, as would be well understood in the art.

In the receiving chain shown in FIG. 2B, after demultiplexing in demultiplexer 250 and demodulation of all carriers in the band W at demodulator 240 of the receiving earth station, the SVP's transmitted on those carriers are obtained and the ATM cells in those SVPs are routed to their respective destinations. An inverse mapper 230 will provide the SVP's and present them to an SVP unpacking unit 220, which also provides FEC decoding and deinterleaving. The unit 210 performs selective byte processing and time stamp processing, and provides the ATM cells in proper format for further terrestrial communication at terminal 260.

The use of SVP's for ATM transmission via satellite is advocated for several reasons. In a processing satellite, an SVP header can provide destination information more easily than would headers of the individual cells. When it is desired to add some overhead to the cells transmitted by the satellite network, such as for time stamping or outer coding, the percent overhead can be kept small by adding the overhead to a group of cells or SVP, rather than to each cell individually. Furthermore, if some interleaving over several cells is desired, then the SVP provides a suitable cell grouping.

Several baseband processing functions are performed in addition to the digital signal processing function of the MCDD, typically in the unit 120 of the transmission chain of FIG. 2A and the unit 220 of the receiving chain of FIG. 2B. These functions are FEC coding, interleaving, and time stamping. Convolutional coding with Viterbi decoding , supplemented by a Reed Solomon outer code was shown to provide excellent performance for ATM transmissions over satellites. Since the Viterbi decoder can produce long bursts of errors, some interleaving among the cells of an SVP must be performed.

One way to avoid excessive delays is to avoid interleaving. Block codes, such as Golay codes with soft decision decoding, could be used instead of the convolutional code, or a convolutional code could be used with flushing after every cell. This would guarantee that cells will encounter random, not burst, errors since the satellite channel itself is not bursty. The resulting BER performance is expected to be somewhat worse however than it is with the standard Viterbi implementation.

It is desired to keep the CDV values to below 0.5 msec, so as not to contribute significantly to the overall CDV. A simple way of reducing the uncertainty in cell arrival time is to time stamp each cell to indicate its approximate arrival time. In order to keep the time stamp to a few bits, relative time of arrival is used, relative that is to fixed times such as the times at which SVPs are assembled. The processing functions described above, along with the DSP functions of the MCDD, would be readily implemented by one of ordinary skill in the art without undue experimentation.

According to a second embodiment of the present invention, the bandwidth W is divided into multiple frequency subdivisions of various sizes. A user transmitting station is assigned multiple frequency subdivisions. The number and size of the frequency subdivisions assigned to each user station is commensurate with the earth stations current traffic volume, however, the frequency subdivisions assigned to a particular user station need not be adjacent to each other. Preferably, only one frequency slot of appropriate size is assigned to a user station.

For example, a user transmitting station is assigned a single frequency slot proportional to its traffic requirement at the present time. A user transmitting station that requires transmission of 384 kbps would be assigned one frequency slot of 384 kpbs. The user transmitting station would then use this slot to transmit a single carrier single of 384 kbps.

If at a later time, the earth station considered above requires an increase its transmission rate of 128 kbps to 512 kbps, a different frequency slot of a total of 512 kbps may be assigned to the user transmitting station or additional frequency subdivisions at different center frequencies totaling the required additional 128 kbps may also be assigned to this particular user station. The newly assigned frequency subdivisions would also not need to be adjacent to the current frequency subdivisions, provided that the user transmitting station includes a sufficient number of modems and filters to utilize the new frequency subdivisions. In this polyphase transmission scheme, there is no need to change the current transmitting frequency subdivisions even if adjacent subdivisions are not available to increase the user transmitting station's transmitting capacity.

For, multiple carrier transmission/reception, with the carriers in the network having identical bit rates, a technique called "Polyphase Filtering," as discussed in "TDM-FDM Transmultiplexer: Digital Polyphase and FFT," is most appropriate.

Depending on the specific application, an MCDD with single carrier transmission or with multiple carrier transmission may be the best choice. Hybrid designs may also be implemented.

Both the single carrier and multiple carrier techniques rely on Fast Fourier Transforms (FFTs) as a core element in the transmitter and receiver filter bank. The actual DSP implementations make efficient use of digital processing architectures and technology. An ASIC-based hardware development of the invention would result in a compact MCDD for either implementation.

When multiple carrier transmission is used, mapping of satellite frames to frequency subdivisions may be accomplished via one of several mapping schemes. One possible mapping scheme is to map each satellite frame onto a single frequency slot. Another possible scheme is to map the first bit onto the first slot, the second to the second slot, and so on, thus minimizing the delay.

For any selected mapping scheme, the actual mapping of satellite frames to frequency subdivisions is simply a bit reshuffling operation where the input bits forming the incoming satellite frames are reordered in a manner prescribed by the specific mapping scheme to be implemented. Static random access memories (RAMs) in a ping pong configuration may be used with the data written into one RAM sequentially, while data is read from the other RAM in a sequence programmed in an address generator RAM. On the receive side, the inverse operation is performed to assemble the satellite frames from the bits recovered from the various frequency subdivisions.

It is also within the scope of the invention to combine the advantages of both single carrier and multiple carrier transmissions by operating the transmitting user station in multiple carrier mode when lightly loaded (and hence the amplifier may be backed off) and single carrier mode when heavily loaded.

The present invention thus provides several advantages over traditional single carrier TDMA systems. Low rate TDMA, also known as multicarrier TDMA, is a more attractive solution for bandwidth on demand/ATM than single carrier TDMA. In comparing low rate TDMA with the proposed MCDD for satellite based systems, the following factors are taken into account: space segment efficiency, baseband equipment cost and complexity, and amplifier backoff.

From a space segment perspective, the higher efficiency of the ATM/MCDD as compared to the low rate TDMA is clearly an advantage, particularly in light of the high cost of leasing satellite capacity.

The baseband equipment for the MCDD is simpler than the low rate TDMA equipment. The synchronization requirements of the low rate TDMA make for a more complex, and hence more costly and less reliable, operation.

The amplifier backoff factor, which usually favors low rate TDMA over the MCDD, is neutralized by using an MCDD with single carrier transmission/multiple carrier reception, as outlined above. Taking both ground segment and space segment into consideration, ATM/MCDD is the preferred scheme.

FIG. 3 is an illustration of a schematic implementation of the present invention, particularly the methods disclose previously, in a system operating under microprocessor and appropriate program control. The figure expands on the description illustrated in FIGS. 2A and 2B by showing a specific embodiment of the assignment scheme apparatus 300. As illustrated in FIG. 3, after the arriving cells have been processed for packaging in SVP format, FEC encoding and interleaving in unit 310, they are stored in a buffer 320. This buffer is a RAM and the SVP bytes are written in sequential order. Also shown in the figure is the general purpose processor 370 that includes an algorithm for frequency assignment in accordance with the foregoing teachings. The algorithm takes into account whether single or multiple carrier assignment is desired and examines the current frequency plan stored in RAM 380 to decide on the allocation of new frequency slots. The RAM is then updated with the new frequency plan. Also computed in the general purpose processor is the sequence in which the bytes stored in the input buffer must be read in order to correspond to the frequency slots that were assigned. This sequence is then downloaded into the control RAM 360. Finally, on the basis of the content of control RAM 360, the bytes from the input buffer 320 are read into the output buffer 330 in the precise sequence dictated by the algorithm in the general purpose processor 370. The bytes stored in the output buffer 330 are then fed to the modulator and the multiplexer 340 to complete the base band processing and output the processed signals on line 350 for transmission. As many of these devices are standard in the art and would be programmed in accordance with the method and functions disclosed herein, one of ordinary skill in the art could assemble the apparatus without undue experimentation.

Clearly, in a multiple user station environment, the processor 370 and its algorithm, operating with the content of the current frequency plan in RAM 380, would act as a frequency divider for dividing a selected bandwidth into a plurality of frequency subdivisions. The processor and algorithm would also act to assign a first number of frequency subdivisions to an individual user station in the wireless communication system, each of the user stations having a volume of transmission traffic. The first number of frequency subdivisions would have a first total bandwidth commensurate with the volume of transmission traffic of the individual user station. The processor and algorithm would act to change the first number of frequency subdivisions to a second number of frequency subdivisions as the volume of transmission traffic of the individual user station changes. The second number of frequency subdivisions would have a second total bandwidth commensurate with the volume of transmission traffic of the individual user as the volume of transmission traffic changes.

Clearly, in accordance with the disclosed method and the microprocessor implementation disclosed herein, the microprocessor and algorithm also would be operative to add additional frequency subdivisions to the first number of frequency subdivisions to form the second number of frequency subdivisions as said volume of transmission traffic of said individual user station increases. This same structure would be capable of deleting excess frequency subdivisions from the first number of frequency subdivisions to form the second number of frequency subdivisions as the volume of transmission traffic of the individual user station decreases.

Clearly, the foregoing description of the apparatus of FIGS. 2A, 2B and 3 can be made applicable to packet type transmissions, as seen in Internet, ISDN, SS#7 and frame relay applications Although certain preferred embodiments of the present invention have been described, the spirit and scope of the invention is not restricted to that which is described above and it is the claims which are relied upon to define the present invention in accordance with applicable principles of law.

What is claimed is:

1. A method of providing bandwidth on demand service in a wireless communication system having at least one user station, comprising the steps of:

dividing a selected bandwidth into a plurality of frequency subdivisions;

assigning a first number of said frequency subdivisions to an individual user station in said wireless communication system, each of said user stations having a volume of transmission traffic, said first number of said frequency subdivisions having a first total bandwidth commensurate with said volume of transmission traffic of said individual user station; and changing said first number of frequency subdivisions to a second number of frequency subdivisions as said volume of transmission traffic of said individual user station changes, said second number of frequency subdivisions having a second total bandwidth commensurate with said volume of transmission traffic of said individual user as said volume of transmission traffic changes.

2. The method of providing bandwidth on demand service in a wireless communication system according to claim 1, wherein said frequency subdivisions are of equal size.

3. The method of providing bandwidth on demand service in a wireless communication system according to claim 1, wherein said frequency subdivisions are of unequal size.

4. The method of providing bandwidth on demand service in a wireless communication system according to claim 1, wherein frequency subdivisions included in said first number of frequency subdivisions are adjacent in said selected bandwidth spectrum.

5. The method of providing bandwidth on demand service in a wireless communication system according to claim 1, wherein frequency subdivisions included in said second number of frequency subdivisions are adjacent in said selected bandwidth spectrum.

6. The method of providing bandwidth on demand service in a wireless communication system according to claim 4, wherein said frequency subdivisions included in said first number of frequency subdivisions are combined to operate on a first single center frequency.

7. The method of providing bandwidth on demand service in a wireless communication system according to claim 6, wherein frequency subdivisions included in said second number of frequency subdivisions assigned to said individual user station are adjacent and are combined to operate on a second single center frequency.

8. The method of providing bandwidth on demand service in a wireless communication system according to claim 7, wherein said second single center frequency is different from said first single center frequency.

9. The method of providing bandwidth on demand service in a wireless communication system according to claim 1, wherein at least one of said frequency subdivisions of said first number of frequency subdivisions has a center frequency different from other frequency subdivisions of said first number of frequency subdivisions.

10. The method of providing bandwidth on demand service in a wireless communication system according to claim 1, wherein at least one of said frequency subdivisions of said second number of frequency subdivisions has a center frequency different from other frequency subdivisions of said second number of frequency subdivisions.

11. The method of providing bandwidth on demand service in a wireless communication system according to claim 1, wherein said changing step comprises the steps of:

adding additional frequency subdivisions to said first number of frequency subdivisions to form said second number of frequency subdivisions as said volume of transmission traffic of said individual user station increases; and deleting excess frequency subdivisions from said first number of frequency subdivisions to form said second number of frequency subdivisions as said volume of transmission traffic of said individual user station decreases.

12. The method of providing bandwidth on demand service in a wireless communication system according to claim 11, wherein said additional frequency subdivisions are adjacent to said first number of frequency subdivisions in said selected bandwidth spectrum.

13. The method of providing bandwidth on demand service in a wireless communication system according to claim 1, wherein said wireless communication system is an asynchronous transfer mode transmission system.

14. A method of providing bandwidth on demand service in a wireless communication system having at least one user station, comprising the steps of:

dividing a selected bandwidth spectrum into frequency subdivisions of various bandwidth sizes;

assigning a first frequency subdivision to an individual user station in said wireless communication system, each of said user stations having a volume of transmission traffic, said first frequency subdivision having a first bandwidth commensurate with said volume of transmission traffic of said individual user station; and assigning a second frequency subdivision to said individual user station when said volume of transmission traffic of said individual user station changes so that a combined bandwidth of said first and said second frequency subdivision is commensurate with volume.

15. A method of providing bandwidth on demand service in a wireless communication system according to claim 14, wherein said second frequency subdivision replaces said first frequency subdivision when said volume of transmission traffic of said individual user station changes.

16. The method of providing bandwidth on demand service in a wireless communication system according to claim 14, wherein said wireless communication system is an asynchronous transfer mode transmission system.

17. A method of providing bandwidth on demand service in a wireless communication system having at least one user station, comprising the steps of:

dividing a selected bandwidth spectrum into frequency subdivisions of various bandwidth sizes; and assigning a set of multiple frequency subdivisions to an individual user station so that in combination said multiple frequency subdivisions have a bandwidth commensurate with a volume of transmission traffic of said individual user station;

adding frequency subdivisions to said set of multiple frequency subdivisions so that said bandwidth remains commensurate with said volume of transmission traffic of said individual user station as said volume increases; and deleting frequency subdivisions from said set of multiple frequency subdivisions so that said bandwidth remains commensurate with said volume of transmission traffic of said individual user station as said volume decreases.

18. A method of providing bandwidth on demand service in a wireless communication system according to claim 17, wherein at least two of said multiple frequency subdivisions are adjacent in said bandwidth spectrum and said at least two of said multiple frequency subdivisions are combined to operate on a single center frequency.

19. A method of providing bandwidth on demand service in a wireless communication system according to claim 17, wherein each frequency subdivision of said multiple frequency subdivisions assigned to said individual user station has a different center frequency.

20. A method of providing bandwidth on demand service in a wireless communication system according to claim 17, wherein one frequency subdivision of said multiple frequency subdivisions is deleted from said set of multiple frequency subdivisions and a second frequency subdivision is added to said set of multiple frequency subdivisions so that said bandwidth of said multiple frequency subdivisions assigned remains commensurate with said volume of transmission traffic of said individual user station as said volume of transmission traffic changes.

21. The method of providing bandwidth on demand service in a wireless communication system according to claim 17, wherein said wireless communication system is an asynchronous transfer mode transmission system.

22. A method of providing bandwidth on demand service in a wireless communication system having at least one user station, comprising the steps of:
dividing a selected bandwidth into frequency subdivisions of equal bandwidth size;
assigning a first number of said frequency subdivisions to an individual user station in said wireless communication system, each of said user stations having a volume of transmission traffic, said first number of said frequency subdivisions having a total bandwidth commensurate with said volume of transmission traffic of said individual user station; and
changing said first number of frequency subdivisions to a second number of said frequency subdivisions as said volume of transmission traffic of said individual user station changes, said second number of frequency subdivisions having a total bandwidth commensurate with said volume of transmission traffic of said individual user as said volume of transmission traffic changes.

23. The method of providing bandwidth on demand service in a wireless communication system according to claim 22, wherein frequency subdivisions included in said first number of frequency subdivisions are adjacent in said selected bandwidth spectrum.

24. The method of providing bandwidth on demand service in a wireless communication system according to claim 22, wherein frequency subdivisions included in said second number of frequency subdivisions are adjacent in said selected bandwidth spectrum.

25. The method of providing bandwidth on demand service in a wireless communication system according to claim 23, wherein adjacent frequency subdivisions included in said first number of frequency subdivisions are combined to operate on a first single center frequency.

26. The method of providing bandwidth on demand service in a wireless communication system according to claim 25, wherein frequency subdivisions included in said second number of frequency subdivisions assigned to said individual user station are adjacent and are combined to operate on a second single center frequency.

27. The method of providing bandwidth on demand service in a wireless communication system according to claim 26, wherein said second single center frequency is different from said first single center frequency.

28. The method of providing bandwidth on demand service in a wireless communication system according to claim 22, wherein said changing step further comprises the steps of:
adding additional frequency subdivisions to said first number of frequency subdivisions to form said second number of frequency subdivisions as said volume of transmission traffic of said individual user station increases, so that said total bandwidth of said second number of frequency subdivisions is commensurate with said volume of transmission traffic; and
deleting excess frequency subdivisions from said first number of frequency subdivisions to form said second number of frequency subdivisions as said volume of transmission traffic of said individual user station decreases, so that said total bandwidth of said second number of frequency subdivisions is commensurate with said volume of transmission traffic.

29. The method of providing bandwidth on demand service in a wireless communication system according to claim 28, wherein said additional frequency subdivisions are adjacent to said first number of frequency subdivisions in said selected bandwidth spectrum.

30. The method of providing bandwidth on demand service in a wireless communication system according to claim 22, wherein said wireless communication system is an asynchronous transfer mode transmission system.

31. The method of providing bandwidth on demand service in a wireless communication system according to claim 22, wherein said wireless communication system is a frame relay transmission system.

32. The method of providing bandwidth on demand service in a wireless communication system according to claim 22, wherein said wireless communication system is an ISDN protocol-compatible transmission system.

33. The method of providing bandwidth on demand service in a wireless communication system according to claim 22, wherein said wireless communication system is an Internet protocol-compatible transmission system.

34. Apparatus for providing bandwidth on demand service in a wireless communication system having at least one user station, comprising:
a frequency divider for dividing a selected bandwidth into a plurality of frequency subdivisions;
means for assigning a first number of said frequency subdivisions to an individual user station in said wireless communication system, each of said user stations having a volume of transmission traffic, said first number of said frequency subdivisions having a first total bandwidth commensurate with said volume of transmission traffic of said individual user station; and
means for changing said first number of frequency subdivisions to a second number of frequency subdivisions as said volume of transmission traffic of said individual user station changes, said second number of frequency subdivisions having a second total bandwidth commensurate with said volume of transmission traffic of said individual user as said volume of transmission traffic changes.

35. The apparatus for providing bandwidth on demand service in a wireless communication system according to claim 34, wherein said frequency subdivisions are of equal size.

36. The apparatus for providing bandwidth on demand service in a wireless communication system according to claim. 34, wherein said frequency subdivisions are of unequal size.

37. The apparatus for providing bandwidth on demand service in a wireless communication system according to claim 34, wherein frequency subdivisions included in said first number of frequency subdivisions are adjacent in said selected bandwidth spectrum.

38. The apparatus for providing bandwidth on demand service in a wireless communication system according to claim 34, wherein frequency subdivisions included in said second number of frequency subdivisions are adjacent in said selected bandwidth spectrum.

39. The apparatus for providing bandwidth on demand service in a wireless communication system according to claim 38, wherein said frequency subdivisions included in said first number of frequency subdivisions are combined to operate on a first single center frequency.

40. The apparatus for providing bandwidth on demand service in a wireless communication system according to claim 39, wherein frequency subdivisions included in said second number of frequency subdivisions assigned to said individual user station are adjacent and are combined to operate on a second single center frequency.

41. The apparatus for providing bandwidth on demand service in a wireless communication system according to claim 40, wherein said second single center frequency is different from said first single center frequency.

42. The apparatus for providing bandwidth on demand service in a wireless communication system according to claim 34, wherein at least one of said frequency subdivisions of said first number of frequency subdivisions has a center frequency different from other frequency subdivisions of said first number of frequency subdivisions.

43. The apparatus for providing bandwidth on demand service in a wireless communication system according to claim 34, wherein at least one of said frequency subdivisions of said second number of frequency subdivisions has a center frequency different from other frequency subdivisions of said second number of frequency subdivisions.

44. The apparatus for providing bandwidth on demand service in a wireless communication system according to claim 34, wherein said means for changing further comprises:
    means for adding additional frequency subdivisions to said first number of frequency subdivisions to form said second number of frequency subdivisions as said volume of transmission traffic of said individual user station increases; and
    means for deleting excess frequency subdivisions from said first number of frequency subdivisions to form said second number of frequency subdivisions as said volume of transmission traffic of said individual user station decreases.

45. The apparatus for providing bandwidth on demand service in a wireless communication system according to claim 44, wherein said additional frequency subdivisions are adjacent to said first number of frequency subdivisions in said selected bandwidth spectrum.

46. The apparatus for providing bandwidth on demand service in a wireless communication system according to claim 34, wherein said wireless communication system is an asynchronous transfer mode transmission system.

47. The apparatus for providing bandwidth on demand service in a wireless communication system according to claim 34, wherein said wireless communication system is a frame relay transmission system.

48. The apparatus for providing bandwidth on demand service in a wireless communication system according to claim 34, wherein said wireless communication system is an ISDN/SS#7 transmission system.

49. The apparatus for providing bandwidth on demand service in a wireless communication system according to claim 34, wherein said wireless communication system is an Internet transmission system.

50. An apparatus for providing bandwidth on demand service in a wireless communication system having at least one user station, comprising:
    means for dividing a selected bandwidth spectrum into frequency subdivisions of various bandwidth sizes;
    means for assigning a first frequency subdivision to an individual user station in said wireless communication system, each of said user stations having a volume of transmission traffic, said first frequency subdivision having a first bandwidth commensurate with said volume of transmission traffic of said individual user station; and
    means for assigning a second frequency subdivision to said individual user station when said volume of transmission traffic of said individual user station changes so that a combined bandwidth of said first and said second frequency subdivision is commensurate with volume.

51. The apparatus for providing bandwidth on demand service in a wireless communication system according to claim 50, wherein said second frequency subdivision replaces said first frequency subdivision when said volume of transmission traffic of said individual user station changes.

52. The apparatus for providing bandwidth on demand service in a wireless communication system according to claim 50, wherein said wireless communication system is one of an asynchronous transfer mode transmission system, frame relay system, Internet system and ISDN/SS#7 system.

53. An apparatus for providing bandwidth on demand service in a wireless communication system having at least one user station, comprising:
    means for dividing a selected bandwidth spectrum into frequency subdivisions of various bandwidth sizes; and
    means for assigning a set of multiple frequency subdivisions to an individual user station so that in combination said multiple frequency subdivisions have a bandwidth commensurate with a volume of transmission traffic of said individual user station;
    means for adding frequency subdivisions to said set of multiple frequency subdivisions so that said bandwidth remains commensurate with said volume of transmission traffic of said individual user station as said volume increases; and
    means for deleting frequency subdivisions from said set of multiple frequency subdivisions so that said bandwidth remains commensurate with said volume of transmission traffic of said individual user station as said volume decreases.

54. The apparatus for providing bandwidth on demand service in a wireless communication system according to claim 50, wherein at least two of said multiple frequency subdivisions are adjacent in said bandwidth spectrum and said at least two of said multiple frequency subdivisions are combined to operate on a single center frequency.

* * * * *